United States Patent [19]
Oh et al.

[11] Patent Number: 5,654,710
[45] Date of Patent: Aug. 5, 1997

[54] DYNAMIC POWER REDUCTION DIGITAL-TO-ANALOG CONVERTER AND METHOD THEREFOR

[75] Inventors: Sung-Hun Oh, Phoenix; Kenneth M. Potts, Gilbert, both of Ariz.

[73] Assignee: VLSI Technology, Inc., San Jose, Calif.

[21] Appl. No.: 491,178

[22] Filed: Jun. 15, 1995

[51] Int. Cl.[6] .................................................. H03M 1/66
[52] U.S. Cl. ........................................ 341/136; 341/144
[58] Field of Search ................................. 341/144, 136

[56] References Cited

U.S. PATENT DOCUMENTS 5,489,902  2/1996  Shyu et al. ............................. 341/136

*Primary Examiner*—Brian K. Young
*Attorney, Agent, or Firm*—Harry M. Weiss; Jeffrey D. Moy; Harry M. Weiss & Associates, P.C.

[57] ABSTRACT

The present invention relates to a power reduction digital-to-analog (DA) converter current source cell. The power reduction DA converter current source cell is comprised of a DA current source cell for sending a current to a current steering matrix and a switching means coupled to the DA current source cell for dynamically controlling the power dissipation of the DA converter current source cell when the current is not required.

28 Claims, 1 Drawing Sheet

DYNAMIC POWER REDUCTION DIGITAL-TO-ANALOG CONVERTER AND METHOD THEREFOR

BACKGROUND OF THE INVENTION

1. Field of the Invention:

This invention relates generally to digital-to-analog converters and, more specifically, to a digital-to-analog current source cell having a switching means that reduces the dynamic power consumed during times of activity.

2. Description of the Prior Art:

Under current designs, when a digital-to-analog (DA) current steering matrix is active, the current sources are always operational. The output from the current sources is steered to ground or to an output depending on what portion of the current steering matrix is enabled by a control signal (CE). In order to reduce the static power consumed by the current steering matrix, prior art designs implemented a sleep mode during times of matrix inactivity. During the sleep mode, a bias signal, which controls the magnitude of the current from the current source, is shut off, thereby effectively turning off the current source. This reduces the static power consumed by the matrix during times of inactivity. The problem with this solution is that during operation there is a significant amount of power being needlessly dissipated to ground.

Therefore, a need existed to provide an improved DA current source cell. The improved current source cell must produce the same output characteristics as prior art current source cells, yet with the ability to dynamically control the output current to the current steering matrix. This will reduce the power dissipation of the matrix during times of matrix activity without effecting the digital-to-analog function of the circuit.

SUMMARY OF THE INVENTION

It is an object of the present invention to provide an improved digital-to-analog current source cell and method therefor.

It is another object of the present invention to provide an improved digital-to-analog current source cell and method therefor which will reduce the power consumed by the current steering matrix during times of matrix activity.

It is still another object of the present invention to provide an improved digital-to-analog current source cell and method therefor which will produce the same output characteristics of prior art digital-to-analog current source cells yet have the ability to dynamically control the output to the current steering matrix.

BRIEF DESCRIPTION OF THE PREFERRED EMBODIMENT

In accordance with one embodiment of the present invention, a dynamic power reduction digital-to-analog (DA) converter current source cell circuit is disclosed. The current source cell is comprised of a DA current source cell means for providing a current to a current steering matrix. A switching means is coupled to the DA current source cell means for dynamically controlling the power dissipation of the DA current source cell means when the current is not required.

In accordance with another embodiment of the present invention, a method of providing a dynamic power reduction DA converter current source cell circuit is disclosed. The method is comprised of the steps of: providing a DA current source cell means for sending a current to a current steering matrix; and providing switching means coupled to the DA current source cell means for dynamically controlling power dissipation of the DA current source cell means when the current is not required.

The foregoing and other objects, features, and advantages of the invention will be apparent from the following, more particular, description of the preferred embodiments of the invention, as illustrated in the accompanying drawing.

DETAILED DESCRIPTION OF THE PREFERRED EMBODIMENTS

Figure 1:
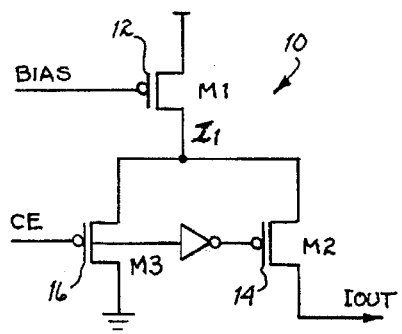
FIG. 1 shows a simplified block diagram of a prior art DA converter current source cell.

Referring to FIG. 1, a prior art digital-to-analog (DA) converter current source cell 10 (hereinafter DA converter 10) is shown. A biasing signal (BIAS) is sent to a transistor 12 to control the magnitude of a current ($I_1$) which is outputted from the transistor 12. The current $I_1$ is then sourced to the output or ground depending on a control signal (CE). If the control signal CE is enabled, a transistor 14 becomes enabled and the current $I_1$ passes through the transistor 14 to an output ($I_{out}$) of the DA converter 10. If the control signal CE is not enabled, a transistor 16 becomes enabled and the current $I_1$ pass through the transistor 16 and is dissipated to ground.

Figure 2:
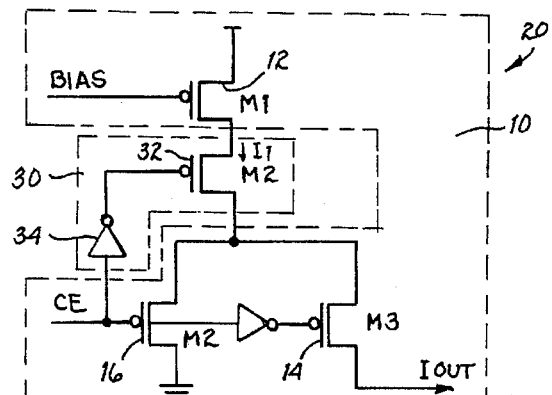
FIG. 2 shows a simplified block diagram of a dynamic power reduction DA converter current source cell of the present invention.

Referring to FIG. 2, a dynamic power reduction DA converter current source cell 20 (herein after power reduction DA converter 20) of the present invention is shown. The power reduction DA converter 20 is comprised of a DA converter 10. The DA converter 10 is the same as DA converter described above in FIG. 1. A switch 30 is coupled to the DA converter 10. The switch 30 dynamically controls the power dissipation of the power reduction DA converter 20 when the output current $I_{out}$ is not required. The switch 30 is comprised of a transistor 32 coupled to an output of transistor 12 and to inputs on both transistor 14 and transistor 16. In the preferred embodiment of the present invention, the transistor 32 is a P-channel MOSFET. A logic gate 34 is coupled to an input of the transistor 32 and to the control signal CE. In accordance with one embodiment of the present invention, the logic gate 34 is an inverter.

The power reduction DA converter 20 will only dissipate power when the control signal CE is enabled. When the control signal CE goes high, the transistor 32, which is coupled to the control signal CE, becomes enabled and allows the current $I_1$ to pass through the transistor 32. The transistor 14, which is coupled to the control signal CE, also becomes enabled when the control signal CE goes high and outputs the current $I_{out}$ to a current steering matrix.

Figure 3:
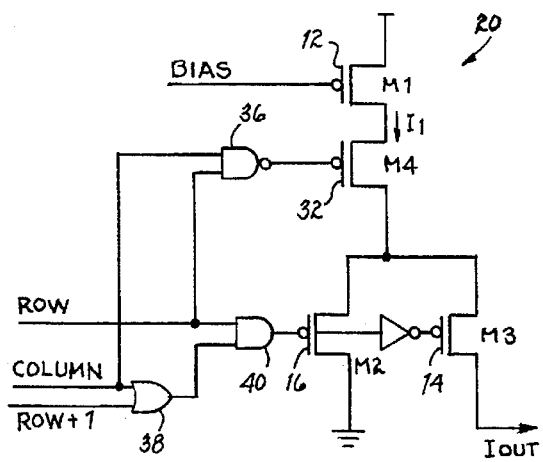
FIG. 3 shows a simplified block diagram of the implementation of logic to control the power reduction DA converter current source cell of FIG. 2.

In order to overcome the limitations of the power reduction DA converter 20 due to the transient settling time caused by the switching of the transistor 32, another embodiment of the present invention is shown in FIG. 3. Referring to FIG. 3, the power reduction DA converter 20 uses a row and column look ahead apparatus to generate the control signal CE ahead of when the output of transistor 14 is required. The control signal CE is now comprised of a row enable signal for enabling a specific row of the current steering matrix; a column enable signal for enabling a specific column of the current steering matrix; and a next row enable signal for enabling the rows preceding the specified row in the current steering matrix. A NAND gate 36 is coupled to the transistor 32 for enabling the transistor 32 when a specific location of the current steering matrix is indicated by the row enable signal and the column enable signal. An OR gate 38 is coupled to the column enable signal and to the next row enable signal for receiving the aforementioned enabling signals. An AND gate 40 is coupled to the row enable signal and to an output of the OR gate 38. The AND gate 40 sends the enabling signals to the transistor 14 in order to activate the transistor 14 so that the output current $I_{out}$ may be sent to the current steering matrix.

The logic gates, NAND gate 36, OR gate 38 and AND gate 40, are configured to allow the transients to settle out and to control every current source cell in the current steering matrix. The logic gates form a switching matrix which steers the current $I_1$ to output $I_{out}$ when both the row enable signal and the column enable signal are high. When both signals are high, the gate of transistor 32 is enabled before the gate of transistor 14 is enabled. Hence, the current transients in transistor 32 settle down before transistor 14 is activated. When only one of the enable signals (either row enable or column enable) is high, the transistor 32 is not enabled which results in no current flow. This configuration allows for maximum power reduction.

Figure 4:
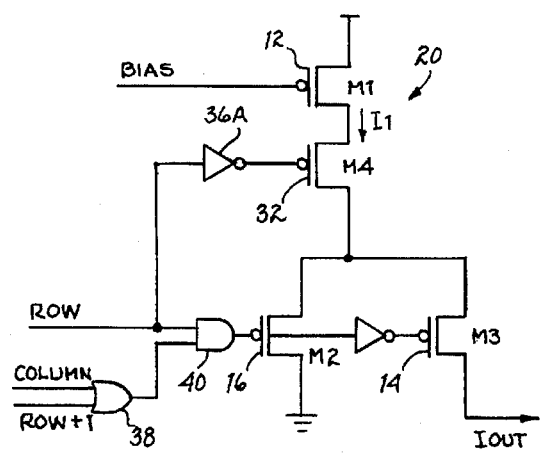
FIG. 4 shows a simplified block diagram of another embodiment of the logic to control the power reduction DA converter current source cell of FIG. 2.

Referring to FIG. 4, another embodiment of the present invention is shown. The power reduction DA converter 20 is the same as the power reduction DA converter 20 shown in FIG. 3 except the NAND gate 36 is now an inverter 36A and is only coupled to the row enable signal. The embodiment shown in FIG. 4 activates an entire row in the current steering matrix if any one cell in that matrix row requires activation. This embodiment results in a smaller transistor count at the cost of slightly increased power dissipation.

Figure 5:
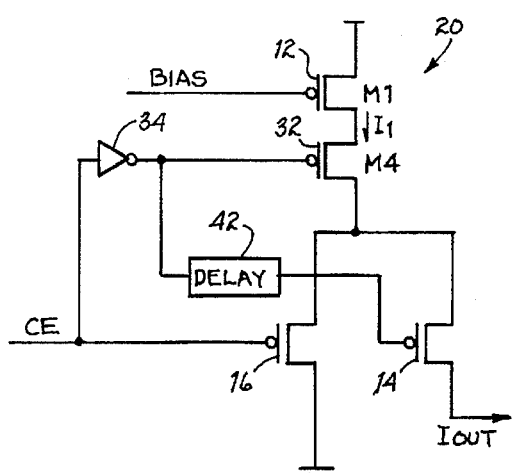
FIG. 5 shows a simplified block diagram of another embodiment of the dynamic power reduction DA converter current source cell of the present invention.

Referring to FIG. 5, another embodiment of the power reduction DA converter 20 is shown. The power reduction DA converter 20 shown in FIG. 5 is similar to the embodiment shown in FIG. 2 with the addition of a delay element 42. The delay element 42 is coupled to an output of the logic gate 34 and to the input of the transistor 14. In operation, when the control signal goes high and the transistor 32 becomes enabled, the delay means 42 provides enough time for the transistor 32 to settle down before the transistor 14 is activated to output the current $I_{out}$ to the current steering matrix. The delay element may be a resistor, a capacitor, or any other type of delay device.

Figure 6:
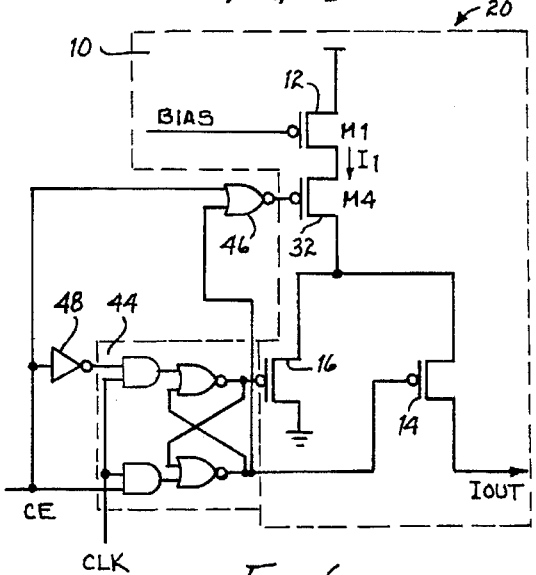
FIG. 6 shows a simplified block diagram of another embodiment of the dynamic power reduction DA converter current source cell of the present invention.

Referring to FIG. 6, another embodiment of the power reduction DA converter 20 is shown. This particular embodiment is for high frequency operation. This embodiment is comprised of a pipe lining structure 44 coupled to the DA converter 10 to provide enough settling time for the transistor 32. The pipe lining structure 44 is coupled to the control signal CE, a clock signal (CLK), and to an output of an inverter 48, the input of the inverter being coupled to the control signal CE. The control signal CE and an output from the pipe lining structure 44 are coupled to an input of a NOR gate 46. The output of the NOR gate is coupled to the transistor 32 which acts as a switch to dynamically control the power dissipation of the power reduction DA converter 20. When the clock signal CLK is low, if the control signal CE goes high, the transistor 32 is enabled regardless of the input signal from the pipelining structure 44. The control signal CE is propagating to the gate of transistor 14 when the clock signal CLK goes high. When the clock signal CLK goes low and the control signal CE changes, the transistor 32 is still enabled until the clock signal CLK goes high. However, when the control signal is low, the transistor 32 is turned off by the falling edge of the control signal, and no current $I_1$ flows through the transistor 32. As a result, the power dissipation is prevented when the current $I_{out}$ is not required.

While the invention has been particularly shown and described with reference to preferred embodiments thereof, it will be understood by those skilled in the art that the foregoing and other changes in form and details may be made therein without departing from the spirit and scope of the invention.

We claim:

1. A dynamic power reduction digital-to-analog converter current source cell circuit comprising, in combination:

bias signal means for generating a signal to control a magnitude of a current to be outputted;

digital-to-analog current source cell means coupled to said bias signal means for sending said current to a current steering matrix when activated by said bias signal means;

steering signal means coupled to said digital-to-analog current source cell means for signalling said digital-to-analog current source cell means to output said current to said current steering matrix when said steering signal means is active; and switching means coupled to said digital-to-analog current source cell means and to said steering signal means for dynamically controlling power dissipation of said digital-to-analog current source cell means when said current is not required to be outputted to said current steering matrix and said digital-to-analog current source cell means is active.

2. A dynamic power reduction digital-to-analog converter in accordance with claim 1 wherein said digital-to-analog current source cell means is comprised of:

first transistor means for generating said current for said current steering matrix;

bias signaling means coupled to said first transistor means for controlling a magnitude of said current;

second transistor means coupled to said first transistor means for dissipating said current to ground;

third transistor means coupled to said first transistor means for outputting said current to said current steering matrix;

enable signal means coupled to said second transistor means and said third transistor means for enabling said third transistor means so said third transistor means may output said current to said current steering matrix when said current is required by said current steering matrix and for enabling said second transistor means so said second transistor means can dissipate said current to ground; and inverter means coupled to said third transistor means for receiving said enable signal means and for sending said enable signal means to said third transistor means to enable said third transistor means.

3. A dynamic power reduction digital-to-analog converter in accordance with claim 2 wherein said switching means is comprised of:

fourth transistor means coupled to said first transistor means of said digital-to-analog current source cell means for dynamically controlling the power dissipation of said digital-to-analog current source cell means; and logic means coupled to said enable signal means and to said fourth transistor means for sending said enable signal means to said fourth transistor means to enable said fourth transistor means.

4. A dynamic power reduction digital-to-analog converter in accordance with claim 3 wherein said fourth transistor means is a P-channel MOSFET.

5. A dynamic power reduction digital-to-analog converter in accordance with claim 3 wherein said logic means is an inverter.

6. A dynamic power reduction digital-to-analog converter in accordance with claim 2 wherein said enable signal means is comprised of:

row enable signal means for enabling a specific row of said current steering matrix;

column enable signal means for enabling a specific column of said current steering matrix; and next row enable signal means for enabling rows preceding said specific row in said current steering matrix.

7. A dynamic power reduction digital-to-analog converter in accordance with claim 6 wherein said logic means is comprised of a look ahead circuit.

8. A dynamic power reduction digital-to-analog converter in accordance with claim 7 wherein said look ahead circuit is comprised of:

a NAND gate coupled to said fourth transistor means for enabling said fourth transistor means when a specific location of said current steering matrix is indicated by said row enable signal means and said column enable signal means;

an OR gate coupled to said column enable signal means and to said next row enable signal means for receiving said column enable signal means and said next row enable signal means; and an AND gate coupled to said row enable signal means and to an output of said OR gate for sending a signal to enable said third transistor means so said third transistor means may output said current to said current steering matrix when said current is required by said current steering matrix and for enabling said second transistor means to dissipate said current to ground.

9. A dynamic power reduction digital-to-analog converter in accordance with claim 7 wherein said look ahead circuit is comprised of:

an inverter coupled to said fourth transistor means for enabling said fourth transistor means when a specific location of said current steering matrix is indicated by said row enable signal means;

an OR gate coupled to said column enable signal means and to said next row enable signal means for receiving said column enable signal means and said next row enable signal means; and an AND gate coupled to said row enable signal means and to an output of said OR gate for sending a signal to enable said third transistor means so said third transistor means may output said current to said current steering matrix when said current is required by said current steering matrix and for enabling said second transistor means so said second transistor means can dissipate said current to ground.

10. A dynamic power reduction digital-to-analog converter in accordance with claim 2 wherein said switching means is comprised of:

fourth transistor means coupled to said first transistor means of said digital-to-analog current source cell means for dynamically controlling the power dissipation of said digital-to-analog current source cell means; and delay means coupled to an output of said inverter means and to said fourth transistor means for causing a delay in sending said enable signal means to said fourth transistor means to enable said fourth transistor means.

11. A dynamic power reduction digital-to-analog converter in accordance with claim 1 wherein said digital-to-analog current source cell means is comprised of:

first transistor means for generating said current for said current steering matrix;

bias signaling means coupled to said first transistor means for controlling a magnitude of said current;

second transistor means coupled to said first transistor means for dissipating said current to ground; and third transistor means coupled to said first transistor means for outputting said current to said current steering matrix.

12. A dynamic power reduction digital-to-analog converter in accordance with claim 11 wherein said switching means is comprised of:

fourth transistor means coupled to said first transistor means of said digital-to-analog current source cell means for dynamically controlling the power dissipation of said digital-to-analog current source cell means;

logic means coupled to said fourth transistor means and to said digital-to-analog current source cell means for sending a signal to said fourth transistor means to enable said fourth transistor means and for sending a signal to said digital-to-analog current source cell means to provide enough settling time for said fourth transistor means; and signaling means coupled to said logic means for enabling said fourth transistor means and for providing enough settling time for said fourth transistor means.

13. A dynamic power reduction digital-to-analog converter in accordance with claim 12 wherein said signaling means is comprised of:

enable signal means coupled to said switching means and to said logic means for enabling said digital-to-analog current source cell means to output said current to said current steering matrix when said current is required by said current steering matrix and for enabling said digital-to-analog current source cell means to dissipate said current to ground; and clock signal means coupled to said logic means for providing enough settling time for said fourth transistor means.

14. A dynamic power reduction digital-to-analog converter in accordance with claim 12 wherein said logic means is comprised of:

pipe lining structure means coupled to said enable signal means and to said clock signal means for providing enough settling time for said fourth transistor means;

an inverter coupled to said enable signal means and to said pipe lining structure means for sending a signal from said enable signal means to said pipe lining structure means; and a NOR gate coupled to said enable signal means and to an output of said pipe lining structure means for sending a signal to enable said fourth transistor means.

15. A method of providing a dynamic power reduction digital-to-analog converter current source cell circuit comprising the steps of:

providing bias signal means for generating a signal to control a magnitude of a current to be outputted;

providing digital-to-analog current source cell means coupled to said bias signal means for sending said current to a current steering matrix when activated by said bias signal means;

providing steering signal means coupled to said digital-to-analog current source cell means for signalling said digital-to-analog current source cell means to output said current to said current steering matrix when said steering signal means is active; and providing switching means coupled to said digital-to-analog current source cell means and to said steering signal means for dynamically controlling power dissipation of said digital-to-analog current source cell means when said current is not required to be outputted to said current steering matrix and said digital-to-analog current source cell means is active.

16. The method of claim 15 wherein said step of providing digital-to-analog current source cell means further comprises the steps of:

providing first transistor means for generating said current for said current steering matrix;

providing bias signaling means coupled to said first transistor means for controlling a magnitude of said current;

providing second transistor means coupled to said first transistor means for dissipating said current to ground;

providing third transistor means coupled to said first transistor means for outputting said current to said current steering matrix;

providing enable signal means coupled to said second transistor means and said third transistor means for enabling said third transistor means so said third transistor means may output said current to said current steering matrix when said current is required by said current steering matrix and for enabling said second transistor means so said second transistor means can dissipate said current to ground; and providing inverter means coupled to said third transistor means for receiving said enable signal means and for sending said enable signal means to said third transistor means to enable said third transistor means.

17. The method of claim 16 wherein said step of providing switching means further comprises the steps of:

providing fourth transistor means coupled to said first transistor means of said digital-to-analog current source cell means for dynamically controlling the power dissipation of said digital-to-analog current source cell means; and providing logic means coupled to said enable signal means and to said fourth transistor means for sending said enable signal means to said fourth transistor means to enable said fourth transistor means.

18. The method of claim 17 wherein said step of providing said fourth transistor means further comprises the step of providing a P-channel MOSFET.

19. The method of claim 17 wherein said step of providing logic means further comprises the step of providing an inverter.

20. The method of claim 16 wherein said step of providing enable signal means further comprises the steps of:

providing row enable signal means for enabling a specific row of said current steering matrix;

providing column enable signal means for enabling a specific column of said current steering matrix; and providing next row enable signal means for enabling rows preceding said specific row in said current steering matrix.

21. The method of claim 20 wherein said step of providing logic means further comprises the step of providing a look ahead circuit.

22. The method of claim 21 wherein said step of providing a look ahead circuit further comprises the steps of:

providing a NAND gate coupled to said fourth transistor means for enabling said fourth transistor means when a specific location of said current steering matrix is indicated by said row enable signal means and said column enable signal means;

providing an OR gate coupled to said column enable signal means and to said next row enable signal means for receiving said column enable signal means and said next row enable signal means; and providing an AND gate coupled to said row enable signal means and to an output of said OR gate for sending a signal to enable said third transistor means so said third transistor means may output said current to said current steering matrix when said current is required by said current steering matrix and for enabling said second transistor means to dissipate said current to ground.

23. The method of claim 21 wherein said step of providing a look ahead circuit further comprises the steps of:

providing an inverter coupled to said fourth transistor means for enabling said fourth transistor means when a specific location of said current steering matrix is indicated by said row enable signal means;

providing an OR gate coupled to said column enable signal means and to said next row enable signal means for receiving said column enable signal means and said next row enable signal means; and providing an AND gate coupled to said row enable signal means and to an output of said OR gate for sending a signal to enable said third transistor means so said third transistor means may output said current to said current steering matrix when said current is required by said current steering matrix and for enabling said second transistor means to dissipate said current to ground.

24. The method of claim 16 wherein said step of providing switching means further comprises the steps of:

providing fourth transistor means coupled to said first transistor means of said digital-to-analog current source cell means for dynamically controlling the power dissipation of said digital-to-analog current source cell means; and providing delay means coupled to an output of said inverter means and to said fourth transistor means for causing a delay in sending said enable signal means to said fourth transistor means to enable said fourth transistor means.

25. The method of claim 15 wherein said step of providing digital-to-analog current source cell means further comprises the steps of:

providing first transistor means for generating said current for said current steering matrix;

providing bias signaling means coupled to said first transistor means for controlling a magnitude of said current;

providing second transistor means coupled to said first transistor means for dissipating said current to ground; and providing third transistor means coupled to said first transistor means for outputting said current to said current steering matrix.

26. The method of claim 25 wherein said step of providing switching means further comprises the steps of:

providing fourth transistor means coupled to said first transistor means of said digital-to-analog current source cell means for dynamically controlling the power dissipation of said digital-to-analog current source cell means;

providing logic means coupled to said fourth transistor means and to said digital-to-analog current source cell means for sending a signal to said fourth transistor means to enable said fourth transistor means and for sending a signal to said digital-to-analog current source cell means to provide enough settling time for said fourth transistor means; and providing signaling means coupled to said logic means for enabling said fourth transistor means and for providing enough settling time for said fourth transistor means.

27. The method of claim 26 wherein said step of providing signaling means further comprises the steps of:

providing enable signal means coupled to said switching means and to said logic means for enabling said digital-to-analog current source cell means to output said current to said current steering matrix when said current is required by said current steering matrix and for enabling said digital-to-analog current source cell means to dissipate said current to ground; and providing clock signal means coupled to said logic means for providing enough settling time for said fourth transistor means.

28. The method of claim 26 wherein said step of providing logic means further comprises the steps of:

providing pipe lining structure means coupled to said enable signal means and to said clock signal means for providing enough settling time for said fourth transistor means;

providing an inverter coupled to said enable signal means and to said pipe lining structure means for sending a signal from said enable signal means to said pipe lining structure means; and providing a NOR gate coupled to said enable signal means and to an output of said pipe lining structure means for sending a signal to enable said fourth transistor means.

* * * * *